Dec. 26, 1961 P. L. BARGELLINI 3,015,075

SIGNAL AMPLITUDE RESPONSIVE CLASS-B BIASING CIRCUIT

Filed March 31, 1955

INVENTOR.
PIER L. BARGELLINI
BY
[signature]
ATTORNEY

United States Patent Office 3,015,075

Patented Dec. 26, 1961

3,015,075

SIGNAL AMPLITUDE RESPONSIVE CLASS-B BIASING CIRCUIT

Pier L. Bargellini, Morton, Pa., assignor to Radio Corporation of America, a corporation of Delaware Filed Mar. 31, 1955, Ser. No. 498,182
4 Claims. (Cl. 330—15)

This invention relates in general to signal amplifier circuits of the class B and class AB type and in particular to means for achieving stable and distortion-free circuit operation of signal amplifier circuits of these types. More particularly, the present invention relates to means for stabilizing the circuit operation of class B and class AB signal amplifier circuits of the type utilizing transistors as signal amplifying elements.

One of the problems encountered in the design and construction of signal amplifier circuits is that the circuit operating point and characteristics may change, which results in unstable and, therefore, unreliable circuit operation. One of the factors which may cause this undesired instability is variations in temperature. This is particularly true in the case of signal amplifying devices of the semi-conductor type, such as transistors. Presently available transistors may be temperature sensitive and variations in temperature may affect their operation.

Varous schemes have been used with varying degrees of success to compensate for these temperature variations. In class A amplifier circuits, for example, direct current feedback has been used with success. In amplifiers of the class B or class AB type, however, where the direct current components are dependent on the amplitude of the signal, feedback compensation has not generally been used.

In the case of transistor amplifier circuits, it has been found that by placing a resistor having an appreciable resistance in series with the emitter lead, compensation for variations in temperature may be achieved. At the same time, however, the gain of the amplifier circuit is reduced, which is often undesirable. One way of maintaining the gain of the amplifier circuit is to bypass the emitter resistor with a capacitor. If this is done in class B or AB amplifiers, however, distortion is introduced as the signal level changes due to changes in bias.

It is, accordingly, a principal object of the present invention to provide improved signal amplifier circuits of the class B or AB type which are stable and substantially distortion-free in operation.

It is another object of the present invention to provide improved class B and AB signal amplifying circuits utilizing transistors as active signal amplifying elements wherein stable circuit operation is achieved without imparing the gain of the amplifier circuits.

It is yet another object of the present invention to provide improved class B and AB signal amplifying circuits wherein stable circuit operation is achieved despite variations in ambient temperature and which are characterized by relatively high gain and substantially distortion-free circuit operation.

It is a still further object of the present invention to provide an improved class B or class AB amplifier circuit utilizing transistors as signal amplifying elements wherein direct current feedback is provided for stabilizing the circuit operation without impairing the gain of the circuit and wherein the circuit operation s substantally distortion-free.

These and further objects and advantages of the present invention are achieved, in general, by using direct current feedback to stabilize the circuit operation of a class B or class AB amplifier circuit. To maintain the gain of the circuit and to reduce distortion, means are provided for applying a signal responsive bias which is derived from the amplifier circuit to compensate for the changes in bias due to signal level changes. In the embodiment of the invention utilizing transistors as active signal amplifying elements, the circuit operation is stabilized by a resistor which is by-passed by a capacitor and which is connected in series with the emitter of the transistor. In order to compensate for the distortion introduced as the signal level changes, a signal is derived from the amplifier circuit and rectified and applied to the electrodes of the transistor to compensate for the changes in bias due to signal level changes. In this manner, stable, high gain and substantially distortion-free circuit operation is achieved.

The novel features that are considered characteristic of this invention are set forth with particularity in the appended claims. The invention itself, however, both as to its organization and method of operation, as well as additional objects and advantages thereof, will best be understood from the following description when read in connection with the acompanying drawing, in which:

Figure 1:
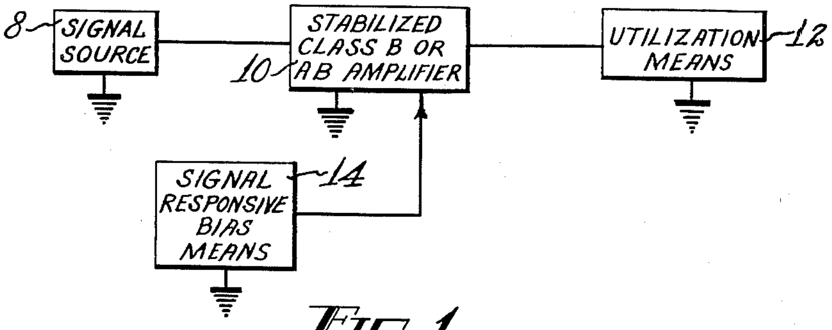
FIGURE 1 is a schematic circuit diagram, in block form, of a class B or AB signal amplifying circuit embodying the invention.

Referring now to the drawing, wherein like parts are indicated by like reference numerals throughout the FIGURES and referring particularly to FIGURE 1, a class B or class AB signal amplifying circuit includes a signal source 8, such as, for example, a source of sine wave energy, the output of which is connected to an amplifier 10 of the class B or class AB type, which is stabilized for ambient temperature variations, for example, and the output of which is connected to a utilization circuit 12 of any well known suitable type. In addition, and in acocrdance with the present invention, a bias means 14 is provided which is responsive to the signal in some portion of the amplifier circuit to provide a control signal, such as a bias voltage or current, which is proportional to the level of the signal to which it is responsive and from which it is derived. The bias voltage or current which is so derived is applied to the class B or class AB amplifier 10 as shown.

In operation, the signal from the signal source 8 is applied to the input of the class B or class AB amplifier circuit 10. The class B or class AB amplifier 10 as noted above is stabilized, for example, by direct current feedback. In the usual case, this will result in signal distortion so that in the absence of the bias means 14 the signal which is applied to the utilization means 12 is distorted.

In accordance with the invention, however, the bias means 14 is responsive to the amplitude of the signal in some portion of the circuit. The control signal or bias so developed, which is proportional to the amplitude of the signal in the amplifier circuit, is then used to compensate for the undesired direct current components introduced by the signal due to the fact that the class B or class AB amplifier circuit 10 is stabilized as described. Thus, in accordance with the invention, stable circuit operation is achieved and at the same time the circuit gain is maintained at a sufficiently high level and signal distortion is minimized.

Figure 2:
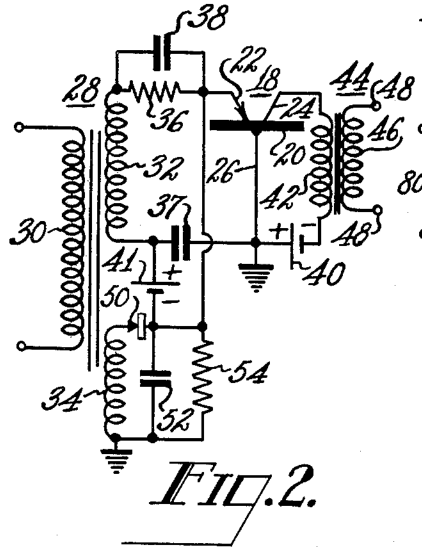
FIGURE 2 is a schematic circuit diagram of a class B signal amplifying circuit utilizing a transistor as the signal amplifying element and embodying the invention.

In FIGURE 2, a class B signal amplifying circuit includes a transistor 18 comprising a semi-conductive body 20 with which an emitter 22, a collector 24 and a base 26 are cooperatively associated in a well known manner. The transistor 18 may be considered to be, for example, a junction transistor of the P-N-P type although other type transistors and transistors of an opposite conductivity type (i.e., P type transistors) could be used. If opposite conductivity transistors are used, however, the potential of the biasing voltages would have to be reversed.

Input signals are applied to the circuit through an input transformer 28, which includes a primary winding 30 and a pair of secondary windings 32 and 34. Direct current stabilization of the transistor 18 is provided by a resistor 36, which is connected in series between the upper end of the first secondary winding 32 and the emitter 22 of the transistor 18. In order to maintain the gain of the amplifier circuit at a sufficiently high level, the resistor 36 is shunted by a capacitor 38. The other or lower end of the first secondary winding 32 is coupled through a blocking capacitor 37 to the base 26, which is connected as shown to a point of fixed reference potential or ground for the system.

Proper biasing for class B operation of the amplifier circuit is provided by a pair of batteries 40 and 41. As used herein, the term "class B" refers to a transistor amplifier circuit wherein the collector current is substantially zero for an appreciable part of alternate half cycles of the applied input signal, and should be taken as referring to both class B and class AB operation as they are commonly accepted. The battery 40 has its positive terminal grounded and its negative terminal connected through a primary winding 42 of an output transformer 44 to the collector 24 of the transistor 18. The positive terminal of the battery 41 is connected through the secondary winding 32 of the input transformer 28 and the stabilizing resistor 36 to the emitter 22.

The output transformer 44 further includes a secondary winding 46. A pair of output terminals 48, which are connected to either end of the secondary winding 46, are provided from which an amplified output signal may be derived. To develop a signal responsive control or bias signal in accordance with the invention, one end of the second secondary winding 34 of the input transformer 28 is connected to the anode of a diode rectifier 50. Filtering means comprising a capacitor 52 and a resistor 54 are connected in parallel with each other and with the winding 34. The upper end of the resistor 54 is connected directly with the emitter 22 of the transistor 18.

In operation, as was explained hereinbefore, the batteries 40 and 41 are chosen so that the transistor 18 is biased for class B operation. The transistor 18 is also stabilized for changes in ambient temperature by the emitter resistor 36. Since the emitter resistor 36 reduces the gain of the amplifier circuit, however, it is by-passed by the capacitor 38. While by-passing the emitter resistor 36 maintains the gain, distortion is introduced as the signal level changes due to changes in the emitter to base biasing voltage. On alternate half cycles of the applied input signal the capacitor 38 will charge up and this charge tends to bias the emitter in the reverse or non-conducting direction with respect to the base.

To eliminate this distortion, and at the same time permit the stabilization of the circuit with ambient temperature variations, in accordance with the invention, a portion of the input signal is applied through the secondary winding 34 to the diode rectifier 50. The rectified signal is then used as a control signal, such as a direct current bias current or voltage, to compensate for the aforementioned changes in the emitter-to-base bias voltage. As shown, the diode rectifier 50 is poled so as to develop a voltage across the resistor 54 which is in a direction which tends to bias the emitter 22 relative to the base 26 in the forward or conducting direction. If a transistor of P type conductivity were used, the polarity of the diode 50 would have to be reversed.

Figure 3:
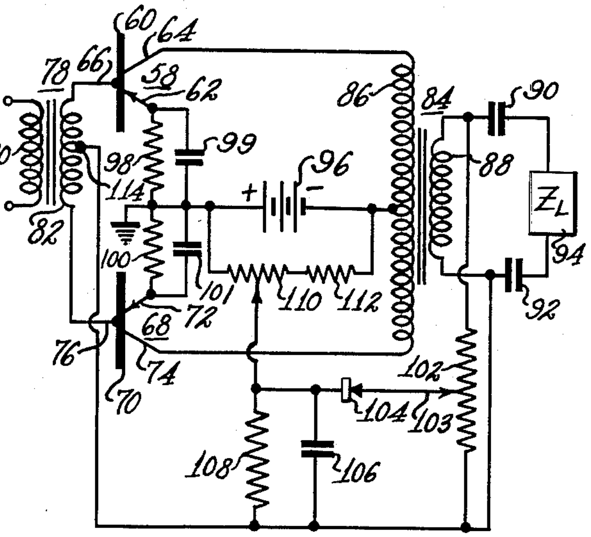
FIGURES 3 and 4 are schematic circuit diagrams of push-pull class B signal amplifying circuits utilizing transistors as signal amplifying elements and embodying the present invention.

In FIGURE 3, a push-pull amplifier of the class B type includes a pair of transistors 58 and 68 of the same conductivity type and which may be considered to be, for example, P-N-P junction transistors. The transistor 58 includes a semi-conductive body 60 with which an emitter 62, a collector 64 and a base 66 are cooperatively associated. Similarly, the transistor 68 includes a semi-conductive body 70 and an emitter 72, a collector 74 and a base 76. Input signals are applied to the circuit through an input transformer 78 having a primary winding 80 and a secondary winding 82, one end of which is connected to the base 66 and the other end of which is connected directly with the base 76 of the other transistor. An output transformer 84 is also provided and includes a primary winding 86, the upper end of which is connected with the collector 64 and the other or lower end of which is connected with the collector 74.

The secondary winding 88 of the output transformer is connected through coupling capacitors 90 and 92 to suitable utilization means, such as a load impedance element 94. Biasing potentials for the circuit are provided by a battery 96, the positive terminal of which is grounded and the negative terminal of which is connected through the upper half of the primary winding 86 to the collector 64 and through the lower half of the primary winding 86 to the collector 74.

Stabilization of the amplifier circuit is provided by connecting the emitters 62 and 72 of the transistors 58 and 68 respectively through stabilizing resistors 98 and 100 to ground. Each of the resistors 98 and 100 is by-passed by a capacitor 99 and 101, respectively. In order to reduce circuit distortion while maintaining stable and high gain circuit operation in accordance with the invention, a portion of the output signal is rectified to produce a control signal such as a direct current bias voltage or current, which is used to compensate for the changes in bias due to changes in signal level. To this end, the junction of the secondary winding 88 of the output transformer 84 and the capacitor 90 is connected through the upper half of a resistor 102 and a tap 103 thereof, to the anode of a diode rectifier 104.

A time constant network is also provided comprising a capacitor 106 and a resistor 108, which are connected in parallel with each other. The upper end of the resistor 108 is connected to a resistor 110 of a voltage dividing network which also includes a resistor 112 which is serially connected with the resistor 110. The resistors 110 and 112 of the voltage dividing network are connected in series with each of other between the terminals of the biasing battery 96. To complete the circuit, the lower end of the resistor 108 is connected to a center tap 114 of the secondary winding 82 of the input transformer 78.

In operation, stable and high gain circuit operation is maintained by the emitter stabilizing resistors 98 and 100 and the by-pass capacitors 99 and 101. Under ordinary conditions as explained above, this circuit arrangement results in signal distortion due to changes in bias as the level of the input signal changes. In accordance with the invention, these changes in bias are compensated for by rectifying a portion of the output signal and applying the control bias voltage or current so derived between the emitter and base electrodes of the transistors 58 and 68. The control bias so applied is of such polarity as to effectively compensate for the changes in bias due to changes in the signal level. Accordingly, the push-pull signal which is derived across the load 94 is substantially distortion-free. At the same time, by provision of the invention, stable and relatively high gain circuit operation is achieved. As in FIGURE 2, the conductivity of the transistors 58 and 68 could be reversed so long as the polarity of the biasing battery 96 and of the diode rectifier 104 were also reversed.

Figure 4:
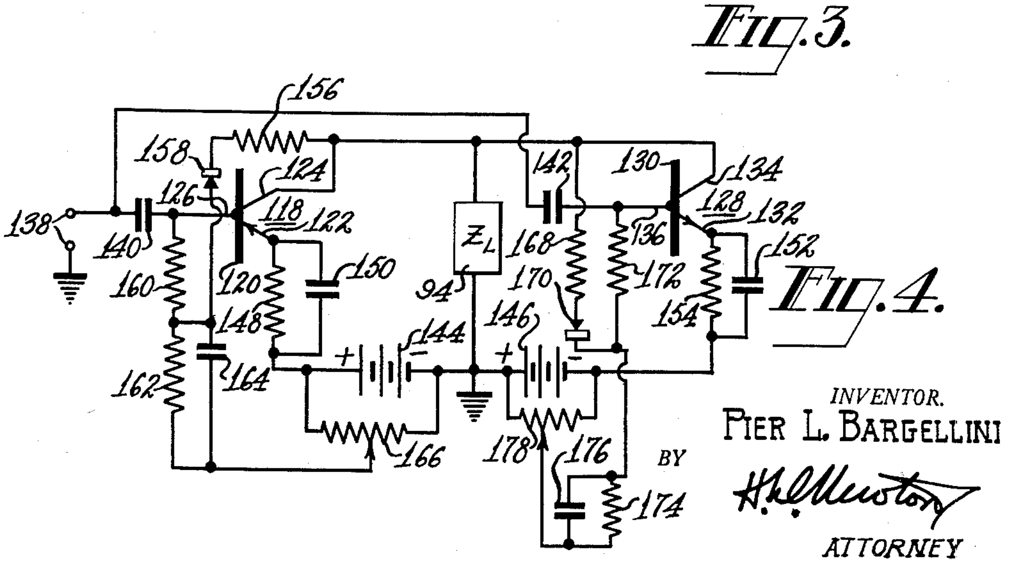

In FIGURE 4, a push-pull class B amplifier circuit includes a pair of transistors 118 and 128 of opposite conductivity or complementary symmetry types. The transistor 118 may be considered to be a P-N-P junction transistor and includes a semi-conductive body with which an emitter 122, a collector 124 and a base 126 are cooperatively associated in a well known manner. The transistor 128, on the other hand, may be considered to be of the N-P-N junction type and includes a semi-conductive body 130 and an emitter 132, a collector 134 and a base 136.

The transistors 118 and 128 are connected for common emitter operation. Accordingly, the load 94 is connected from the junction of the collectors 124 and 134 to ground. Input signals are applied to the circuit from a pair of input terminals 138, one of which is grounded and the other of which is connected through a coupling capacitor 140 to the base 126 of the P-N-P transistor 118 and through a coupling capacitor 142 to the base 136 of the N-P-N transistor 128. To provide the necessary biasing voltages for class 8 operation of the circuit, a pair of batteries 144 and 146 are provided. The negative terminal of the battery 144 is grounded and its positive terminal is connected through a stabilizing resistor 148 to the emitter 122. As in the previous figures, the emitter stabilizing resistor 148 is by-passed by a capacitor 150. The positive terminal of the battery 146 is grounded and its negative terminal is connected through a stabilizing resistor 152 to the emitter 132 of the N-P-N transistor 128. The emitter stabilizing resistor 152 is by-passed by a capacitor 154.

As in FIGURE 3, a portion of the output signal is rectified to provide a signal responsive bias voltage or current which is then used to compensate for the bias voltage developed on alternate half cycles of the input signal, which bias tends to bias the emitter in the reverse or non-conducting direction with respect to the base. To this end, a resistor 156 and a diode rectifier 158 are connected with the output electrode or collector 124 of the P-N-P transistor 118, and the anode of the diode 158 is connected through a resistor 160 to the base 126. The anode of the diode 158 is also connected through a time constant network comprising a resistor 162 and a capacitor 164, a portion of a voltage dividing resistor 166, which is connected across the battery 144, and the emitter stabilizing resistor 148 to the emitter 122 of the P-N-P transistor 118.

Similarly a resistor 168 and a diode rectifier 170 are connected in series with the collector 134 of the N-P-N junction transistor 128. The cathode of the diode 170 is connected through a resistor 172 to the base 136, and through a time constant network comprising a resistor 174 and a capacitor 176, a portion of a voltage dividing resistor 178, which is connected across a battery 146, and the emitter stabilizing resistor 152 to the emitter 132 of the N-P-N transistor 128.

In operation, when a signal is applied to the input terminals 138, it will be amplified and a push-pull signal will be developed across the load 94. As was explained hereinbefore, the circuit has been stabilized by direct current feedback means including the stabilizing resistors 148 and 152 and the gain of the circuit is maintained by bypassing these stabilizing resistors with the capacitors 150 and 154. In order to eliminate signal distortion due to changes in bias with changes in the level of the input signal, a portion of the output signal is rectified by the diode rectifiers 158 and 170. The signal responsive bias which is so developed is of such polarity that it compensates for the changes in self-bias due to changes in the signal. Accordingly, the diodes 158 and 170 are poled and connected in the circuit so as to apply a forward bias between the emitter and base electrodes of each of the transistors in response to the output signal. Thus a complementary symmetry class B push-pull amplifier circuit is stabilized and the available output signal is substantially distortion-free.

As described herein, class B and class AB signal amplifier circuits are stable in operation. Stability is achieved, moreover, without the sacrifice of gain. These results are accomplished by provision of the invention without introducing distortion into the output signal. By provision of the present invention, therefore, the advantages inherent in direct current feedback for stabilization purposes are realized in class B and class AB signal amplifier circuits, while the disadvantages of this method of stabilization are eliminated.

What is claimed is:

1. In a push-pull class B signal amplifier circuit, the combination with a pair of transistors connected and biased for push-pull signal amplifying circuit operation and each having a base, an emitter and a collector electrode, of means for applying an alternating current signal to said transistors, output circuit means for deriving an amplified alternating current signal from said transistors, stabilization means for each of said transistors including an impedance element serially connected between each emitter electrode and a point of reference potential, a bypass capacitor connected in parallel with each of said impedance elements, said stabilization means providing a change in bias for said transistors with variations in the amplitude of said alternating current signal, rectifier means coupled with said output circuit means and responsive to said alternating current signals for providing a direct current control signal, and means for applying said control signal to the electrodes of said transistors to bias the emitter electrodes of said transistors in the forward direction with respect to said base electrodes to compensate for said change in bias and to provide substantially distortion-free operation of said amplifier circuit.

2. A push-pull class B signal amplifier circuit comprising, in combination, a first transistor having a first base, a first emitter and a first collector electrode, a second transistor having a second base, a second emitter and a second collector electrode, said first and second transistors being of the same conductivity type, input circuit means coupled with said first and second base electrodes for applying an alternating current signal thereto, output circuit means coupled with said first and second collector electrodes for deriving an amplified alternating current signal therefrom, a first stabilizing resistor connected in series between said first emitter electrode and a point of reference potential, a first by-pass capacitor connected in parallel with said first resistor, said first stabilizing resistor and first by-pass capacitor comprising a first stabilizing network providing a change in bias for said first transistor with changes in amplitude of said applied alternating current signal, a second stabilizing resistor connected in series between said first emitter electrode and said point of reference potential, a second by-pass capacitor connected in parallel with said second resistor, said second stabilizing resistor and second by-pass capacitor comprising a second stabilizing network providing a change in bias for said second transistor with changes in amplitude of said applied alternating current signal, signal responsive means including a diode rectifier coupled with said output circuit means for providing a direct current control signal proportional to said amplified alternating current signal, and conductive circuit means for applying said control signal to said first and second emitter electrodes for biasing said first and second emitter electrodes in the forward direction with respect to said first and second base electrodes to compensate for said changes in bias and to provide substantially distortion-free operation of said amplifier circuit.

3. A push-pull signal amplifier circuit comprising, in combination, a first transistor of one conductivity type and having a first base, a first emitter and a first collector electrode, a second transistor of an opposite conductivity type and having a second base, a second emitter and a second collector electrode, input circuit means coupled with said first and second base electrodes for applying an alternating current signal thereto, output circuit means connected between said first and second collector electrodes and a point of reference potential for deriving an amplified alternating current signal, a first stabilizing resistor connected in series with said first emitter electrode, a first by-pass capacitor connected in parallel with said first resistor, said first stabilizing resistor and first by-pass capacitor comprising a first stabilizing network providing a change in bias for said first transistor with changes in amplitude of said applied alternating current signal, a second stabilizing resistor connected in series with said second emitter electrode, a second by-pass capacitor connected in parallel with said second resistor, a said second stabilizing resistor and second by-pass capacitor comprising a second stabilizing network providing a change in bias for said second transistor with changes in amplitude of said applied alternating current signal, a first signal responsive means including a first diode rectifier connected with said output circuit means for providing a first direct current control signal of one polarity and proportional to said amplified alternating current signal, a second signal responsive means including a second diode rectifier connected with said output circuit means for providing a second direct current control signal of an opposite polarity and proportional to said amplified alternating current signal, and conductive circuit means for applying said first and second control signals to the electrodes of said first and second transistors respectively for biasing said first and second emitter electrodes in the forward direction with respect to said first and second base electrodes to compensate for said changes in bias and to provide substantially distortion-free operation of said amplifier circuit.

4. A class B signal amplifier circuit comprising, a transistor having base, emitter and collector electrodes and biased to provide class B operation for amplifying an alternating current signal, input circuit means for applying said alternating current signal to said transistor, output circuit means for deriving an amplified alternating current signal from said transistor, stabilization means for said transistor including an impedance element serially connected with said emitter electrode, said stabilization means providing a change in bias for said transistor with variations in the amplitude of said alternating current signal, signal responsive means coupled with said output circuit means and responsive to said amplified alternating current signal for providing a direct current control signal proportional thereto, and means for applying said control signal to the electrodes of said transistor for biasing said emitter electrode in the forward direction with respect to said base electrode to compensate for said change in bias and to provide substantially distortion-free operation of said amplifier circuit.

References Cited in the file of this patent

UNITED STATES PATENTS

| | | |
|---|---|---|
| 1,869,331 | Ballantine | July 26, 1932 |
| 2,680,160 | Yaeger | June 1, 1954 |

FOREIGN PATENTS

| | | |
|---|---|---|
| 74,302 | Denmark | June 3, 1952 |

OTHER REFERENCES

Stern et al. article: Electrical Engineering, December 1954, pp. 1107–1112.

Shea text: "Principles of Transistor Circuits," pp. 108–115, 121, 133, 148–156, 177–181, published 1953 by John Wiley Sons, New York, N.Y.